(12) United States Patent
Shimizu

(10) Patent No.: US 6,812,875 B2
(45) Date of Patent: Nov. 2, 2004

(54) ANALOG/DIGITAL CONVERTER AND METHOD FOR CONTROLLING THE SAME

(75) Inventor: Kan Shimizu, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 10/254,909

(22) Filed: Sep. 26, 2002

(65) Prior Publication Data

US 2003/0058152 A1 Mar. 27, 2003

(30) Foreign Application Priority Data

Sep. 27, 2001 (JP) ........................................ 2001-298637

(51) Int. Cl.[7] .............................................. H03M 3/00
(52) U.S. Cl. ...................... 341/143; 341/144; 341/155; 341/120
(58) Field of Search ............................... 341/143, 144, 341/155, 141, 152, 156

(56) References Cited

U.S. PATENT DOCUMENTS

| | | | | |
|---|---|---|---|---|
| 4,173,957 A | * | 11/1979 | Hattori et al. | 123/682 |
| 4,827,416 A | * | 5/1989 | Kawagoe et al. | 701/38 |
| 5,014,056 A | * | 5/1991 | Moriwaki | 341/161 |
| 5,208,595 A | * | 5/1993 | Engel et al. | 341/143 |
| 6,177,898 B1 | * | 1/2001 | Ong | 341/155 |
| 6,542,105 B2 | * | 4/2003 | Sakuragi | 341/164 |
| 6,556,164 B2 | * | 4/2003 | Schmid | 341/163 |
| 6,661,363 B2 | * | 12/2003 | Zierhofer | 341/143 |

OTHER PUBLICATIONS

Frank Op't Eynde, et al., "Analog Interfaces for Digital Signal Processing Systems", Kluwer Academic Publishers, 1993, Chapter 3, pp. 96–117.

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

A method for controlling an analog/digital converter circuitry includes generating a digital signal by accumulating a predetermined increment at a predetermined time interval in accordance with a value of a first analog signal input to the analog/digital converter. The digital signal is converted to a second analog signal, the second analog signal is subtracted from the first analog signal, and a detection signal is generated in accordance with a subtraction result. An accumulation mode is selected from accumulation modes in accordance with the detection signal and accumulation is performed at the time interval and in the increment in accordance with the selected accumulation mode.

17 Claims, 7 Drawing Sheets

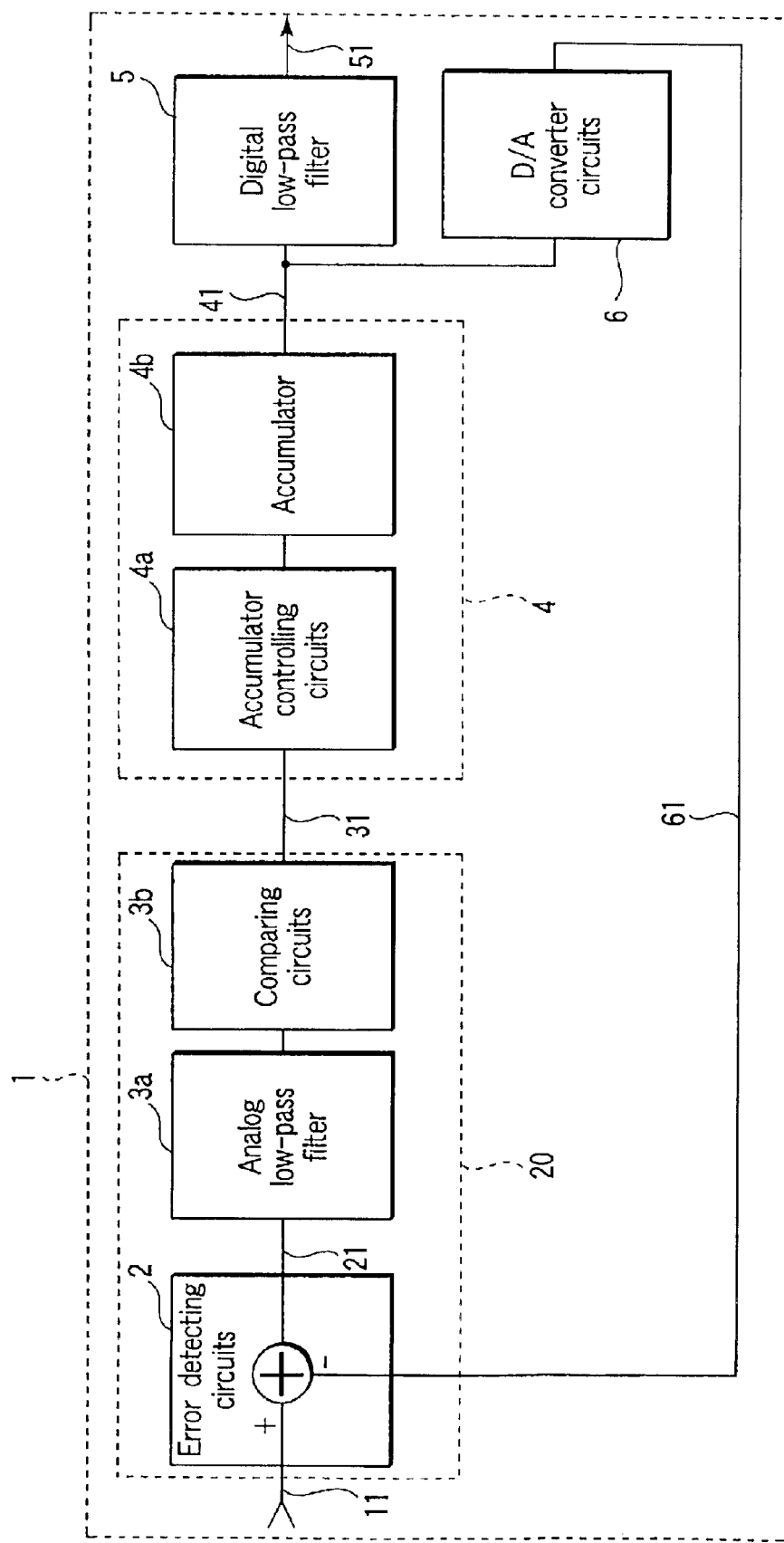
F I G. 1

Page 1/2

```
# Nonlinear controled AD converter

# This is sigma delta like AD converter with faster step response.
#   define p as comparator output polarity
#   If p is same as before, exponentially increase accumulator inputs
#   and if overshoot detected, step back footprint

# inp      Input signal
# Accd     Accelarated mode flag
# lpf_a    Analog Lowpass filter output
# lpf_d    Digital Lowpass filter output
# acc      Accumulator out
# inc      Accumulator input
# incL     increment rate control counter LSB
# p        Comparator output
# p2       lclock delayed Comparator output
# k        Lowpass filter constant
ct4      Acceration control counter maybe function abs (x)
{ if (x<0) return -x; else return x; } function pol (x)
{ if (x<0) return -1; else return 1; } function UpdateACC ()
{ acc += inc;
    if (acc>=32) acc=31; else if (acc<=-32) acc=-31;  #acc overflow correction
}

BEGIN {
    k=0.040;
    ct=0; lpf_a=20; lpf_d=20;
    inc =-1; p2=-1; Accd=1; incL=0;
    th2=512
    TH1=512
    printf ("#lpf_a\tacc\tinp\tinc\tAccd\n");
}
{
    inp=$0+0.0
    if (lpf_a>0)p=1; else p=-1;  # polarity
    if (p*p2>0) { ct4++;incL+=16;} else incL=0;

if (Accd==0) {          # if not in accelarated nore decelated mode
        if (p*p2<0) {       # if polarity changed
            inc=p;          # set acc input as p
            incL=0;         # burst count=0
            ct4=0;
        }
        else {
            inc=int (incL/th2)*p;
            if (incL >=th2)   { incL=0; }
            if (ct4>=th2/8)   {Accd=1; ct4=0; th2/=2;if (th2<1)th2=1)
        }
    }
    else if  (Accd<0) {  #decelerated mode
        if (p*p2<0) {
            tmp=int (abs (inc) /2);
            if  (tmp>1) inc=tmp*p;
            else inc=p;
            incL=th2-incL;   # Dec. 19, 2000 prevent oscilation
#           incL=0;
```

FIG. 5

Page 2/2

```
                    ct4=0;
                    th2 *=2;
                    if (th2>-=TH1) { th2=TH1; Accd=0; }
            }
            else {
                    inc=int (incL/th2) *p;
                    if (incL>=th2) incL=0; }
                    if (ct4>=th2/8) {
                            th2 *=2; if (th2>=TH1) { th2=TH1; Accd=0; }
                            ct4=0;
                    }
            }
    }
    else {                              #accelerated mode
            if (p*p2>0) {
                    Accd=-1;# change to decelerated
                    incL=0;
                    ct4=int (th2/8) -ct4+1;  # Dec. 19, 2000
 #                  ct4=th2/8-ct4+1;
                    inc=abs (inc)*p;
                    th2 *= 2;   # Dec. 19, 2000
            }
            else {
                    inc=int (incL/th2) *p;
                    if (incL >=th2) {   incL=0; }
                    if (ct4>=th2/8) {  ct4=0; th2/=2;if (th2<1) th2=1; }
            }
    }
    UpdateACC ();
    printf ("%6.2f\t%3d\t%3f\t%3d\t%2d\t%d\t%d\t%e\t%d\n",lpf_a,acc,inp,inc,A
    p2=p;

ccd*4, ct4, log (th2) / log(2), lpf_d, th2);
        lpf_a=lpf_a+ ( (inp-acc) - lpf_a) *k;
        lpf_d=lpf_d+ (acc - lpf_d) *k;
}
```

FIG. 6

ANALOG/DIGITAL CONVERTER AND METHOD FOR CONTROLLING THE SAME

CROSS-REFERENCE TO RELATED APPLICATIONS

This application is based upon and claims the benefit of priority from the prior Japanese Patent Application No. 2001-298637, filed Sep. 27, 2001, the entire contents of which are incorporated herein by reference.

BACKGROUND OF THE INVENTION

1. Field of the Invention

The present invention relates generally to an analog/digital converter, and more particularly to an analog/digital converter, which compares an input analog signal to an output of a digital/analog converter, controls the digital/analog converter so that a difference between the input analog signal and the output of the digital/analog converter, and outputs a resultant of the input of the digital/analog converter through a low-pass filter.

2. Description of the Related Art

When the charge and discharge of a rechargeable battery used in a portable device, such as a cellular phone, is controlled, charge and discharge currents of the rechargeable battery are measured and the charge and discharge are controlled based on the measured values. Since an integral value of the current is important when a current is measured, it is preferable that the current value be continuously measured, not a time-discretely. In addition, since a discharge current generally changes abruptly, an analog/digital (A/D) converter with an enough speed is required. A $\Delta\Sigma$-type A/D converter is suitable as an A/D converter that satisfies the above requirements. In general, an A/D converter operates in synchronism with a clock pulse signal of a constant frequency. The frequency of a clock pulse signal of the $\Delta\Sigma$-type A/D converter is at least 100 times the bandwidth of the signal, for example, about 1 MHz in audio equipment.

Power consumption of the internal circuits of a portable device using a rechargeable battery is required to be low. Accordingly, power consumption of the various circuits necessary to constitute a circuit for measuring the charge and discharge current is also required to be low. For this purpose, the clock frequency may be limited to a low value, for example, 32.768 kHz.

As described above, an A/D converter operates synchronously to a clock pulse. Therefore, if the clock pulse is restricted to a low frequency, the A/D converter cannot operate at high speed and the current value cannot be measured continuously.

BRIEF SUMMARY OF THE INVENTION

According to a first aspect of the present invention, there is provided a method for controlling analog/digital converter circuitry, comprising: generating a digital signal by accumulating a predetermined increment at a predetermined time interval in accordance with a value of a first analog signal input to the analog/digital converter; converting the digital signal to a second analog signal; subtracting the second analog signal from the first analog signal and generating a detection signal in accordance with a subtraction result; selecting one of accumulation modes in accordance with the detection signal; and accumulating at the time interval and in the increment in accordance with the selected accumulation mode.

According to a second aspect of the present invention, there is provided analog/digital converter comprising: error detecting circuits having a first input terminal and a second input terminal, the first input terminal supplied with a first analog signal and the second input terminal supplied with a second analog signal; detecting circuits supplied with an output signal of the error detecting circuits; controlling circuits, supplied with an output signal of the detecting circuits, selecting one of accumulation modes determined in accordance with the output signal of the detecting circuits and accumulating at a time interval and in an increment in accordance with the selected accumulation mode; and a digital/analog converter, supplied with an output signal of the controlling circuits and converting the output signal of the controlling circuits to the second analog signal.

BRIEF DESCRIPTION OF THE SEVERAL VIEWS OF THE DRAWING

FIG. 1 is a diagram showing a circuit configuration of an A/D converter according to the present invention;

FIG. 5 is a diagram showing a program written in the awk language, which describes operations of an A/D converter according to the present invention;

FIG. 6 is a diagram showing the subsequent part of the program shown in FIG. 5.

DETAILED DESCRIPTION OF THE INVENTION

Figure 2:
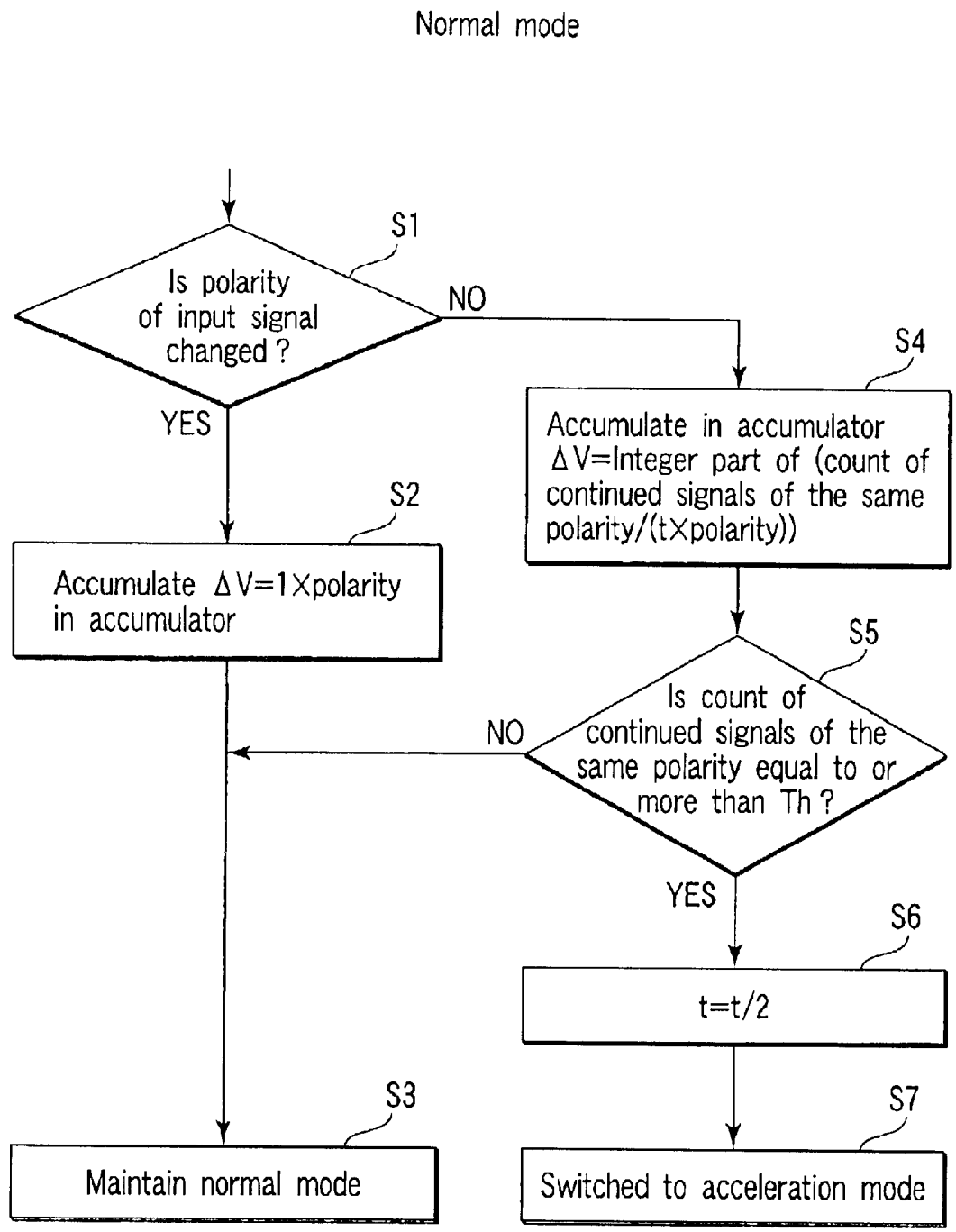
FIG. 2 is a flowchart briefly illustrating an operation of the circuit in FIG. 1 at a normal mode.

An embodiment of the present invention will now be described with reference to the accompanying drawings. In the following description, like reference numerals denote the structural elements substantially the same in function and structure. The description of such an element will be repeated only when it is particularly necessary.

FIG. 1 is a block diagram showing a configuration of an A/D converter according to an embodiment of the present invention. As shown in FIG. 1, the A/D converter 1 of the embodiment has an error polarity detecting section 20, digital/analog (D/A) converter controlling circuits 4, a digital low-pass filter 5 and a D/A converter 6. The error polarity detecting circuits 20 consist of error detecting circuits 2, an analog low-pass filter 3a, comparing circuits 3b.

An analog input signal 11 is supplied to the error polarity detecting circuits 20. The error detecting circuits 2 subtract an output of the D/A converter 6 from the analog input signal 11. Analog low-pass filter outputs a low-frequency component of the resultant of the subtraction. An output signal of the analog low-pass filter 3a is supplied to the comparing circuits 3b.

The comparing circuits 3b output an output signal 31(+1/−1) indicating a positive or negative polarity in accordance with the output signal of the analog low-pass filter 3a. If the analog input signal 11 is greater than an output signal 61 of the D/A converter 6, the analog low-pass filter 3a outputs a positive output signal. When the comparing circuits 3b receive a positive signal, it outputs "+1" as an output signal 31. On the other hand, if the analog input signal 11 is smaller than the output signal 61 of the D/A converter 6, the analog low-pass filter 3a outputs a negative output signal. When the comparing circuits 3b receive a negative signal, it outputs "−1" as the output signal 31.

The output signal 31 of the comparing circuits 3b is supplied to the D/A converter controlling circuits 4. The D/A converter controlling circuits 4 have accumulator controlling circuits 4a and an accumulator 4b. The accumulator controlling circuits 4a successively controls accumulation operations in the accumulator 4b in accordance with the output signal 31 of the comparing circuits 3b. The D/A converter controlling circuits 4 have following three accumulation modes, i.e., a normal mode, an acceleration mode and a deceleration mode. The accumulator controlling circuits 4a determine one of the three accumulation modes in accordance with the polarity of the output signal 31 of the comparing circuits 3b and a count of continued same polarities.

The D/A converter controlling circuits 4 operate substantially as follows. First, the D/A converter controlling circuits 4 are normally set to the normal mode. In the normal mode, the accumulator 4b accumulates at preset time intervals in predetermined increments under the control of the accumulator controlling circuits 4a. Then, the D/A converter controlling circuits 4 are switched to the acceleration mode if certain conditions (to be described later) are satisfied. In the acceleration mode, the speed of the accumulation of the accumulator is exponentially increased.

In the acceleration mode, if certain conditions (to be described later) are satisfied, D/A converter controlling circuits 4 are switched to the deceleration mode. In the deceleration mode, the accumulator 4b accumulates at time intervals longer than those in the normal mode and/or in predetermined increments less than those in the normal mode. In the deceleration mode, the accumulation of speed is exponentially decreased. Thereafter, if certain conditions are satisfied, the D/A converter controlling circuits 4 are switched to the normal mode. Details of the operation and conditions of the D/A converter controlling circuits 4 will be described later more specifically.

An output signal 41 of the D/A converter controlling circuits 4 is supplied to the digital low-pass filter 5 and also to the D/A converter 6.

The D/A converter 6 converts the input signal to an analog signal, and outputs a resultant analog output signal 61. The output signal is feedbacked to the error polarity detecting circuits 20 where a feedback circuit is formed. A feedback operation reduces a difference between the output of the D/A converter 6 and analog input signal 11.

The operation described above is repeated. If analog input signal 11 does not change, a time averaged values between the output of the D/A converter 6 and analog input signal 11 becomes smaller. The input of the D/A converter 6 is outputted as an output 51 of the A/D converter 1 after going through the digital low-pass filter 5. Because the input of the D/A converter 6 is controlled so that the time average of a difference between the output of the D/A converter 6 and analog input signal 11, the A/D converter 1 has a resolution greater than the one of the D/A converter 6.

It is needless to say that a clock pulse generating circuit (not shown) is provided inside or the outside the A/D converter 1, and the A/D converter 1 operates synchronizing with the clock pulse.

Figure 3:
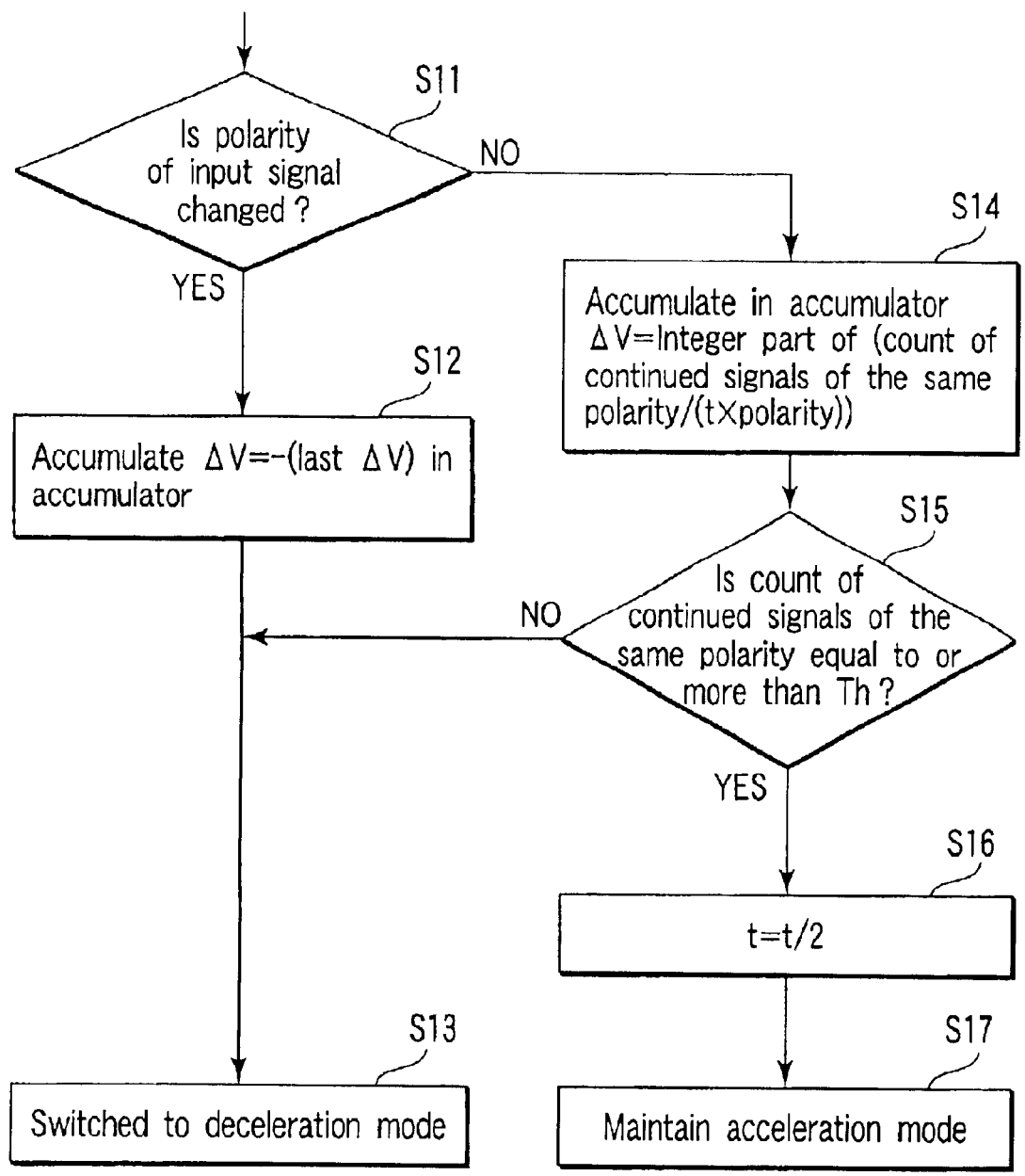
FIG. 3 is a flowchart briefly illustrating an operation of the circuit in FIG. 1 at an acceleration normal mode.
Figure 4:
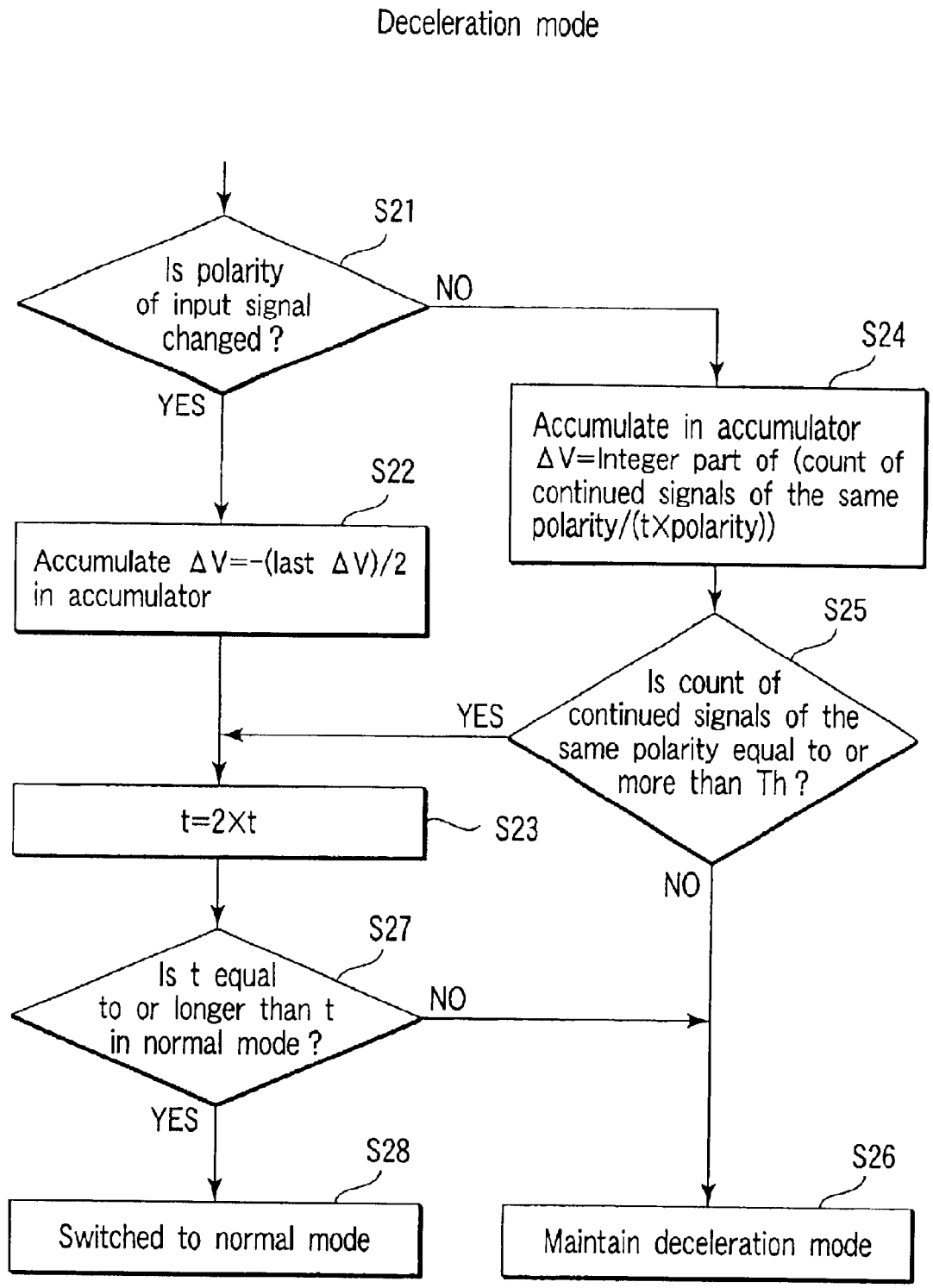
FIG. 4 is a flowchart briefly illustrating an operation of the circuit in FIG. 1 at a deceleration mode.

FIGS. 2 to 4 are flowcharts each showing operations of the D/A converter controlling circuits 4. Operations of the D/A converter controlling circuits 4 will be described below with reference to FIGS. 2 to 4.

FIG. 2 illustrates a normal mode operation of the D/A converter controlling circuits 4. In the normal mode, the time interval between accumulation operations at a point of time and a next point of time is equal to a clock pulse period. The time interval is represented as t. As shown in FIG. 2, it is determined in Step S1 whether the polarity of the input signal 31 changes. The input signal 31 is a signal output from the comparing circuits 3b. If the polarity of the input signal 31 changes, an increment ΔV=1×Polarity is accumulated in the accumulator 4b (Step S2), where change in polarity of the input signal means inversion of the relationship between values of the analog input signal 1 and the output signal 61 of the D/A converter 6. Then, the normal mode is maintained (Step S3).

On the other hand, if the polarity of the input signal 31 does not change, the following increment ΔV is accumulated in the accumulator 4b (Step S4):

ΔV=Integer part of (Count of continued signals of the same polarity/(t×polarity)).

Then, it is determined whether the count of continued signals of the same polarity is equal to or more than a threshold Th (Step S5). A designer can appropriately set the threshold, that can be, for example, 32. If the count of continued signals is less than the threshold Th, the flow advances to Step S3. If the count of continued signals is equal to or more than the threshold Th, the time interval t is decreased to t/2 (Step S6). Then, the D/A converter controlling circuits 4 are switched to the acceleration mode (Step S7).

As described above, in the normal mode, if the polarity of the input signal 31 of the D/A converter controlling circuits 4 changes, the increment ΔV of the predetermined value remains unchanged and the normal mode is maintained. If the signals of the same polarity continue, the increment is increased in accordance with the count of the continued signals. Further, if the count of the continued signals of the same polarity is equal to or more than the predetermined value (threshold Th), the time interval t is decreased to t/2 and thereafter the D/A converter controlling circuits 4 are switched to the acceleration mode.

FIG. 3 illustrates an acceleration mode operation of the D/A converter controlling circuits 4. As shown in FIG. 3, it is determined in Step S11 whether the polarity of the input signal 31 of the D/A converter controlling circuits 4 changes. If the polarity changes, the increment ΔV added last with the inverted polarity is accumulated in the accumulator 4b (Step S12). Then, the D/A converter controlling circuits 4 are switched to the deceleration mode (Step S13).

On the other hand, if the polarity of the input signal 31 does not change, the following increment ΔV is accumulated in the accumulator 4b (Step S14):

ΔV=Integer part of (Count of continued signals of the same polarity/(t×polarity)).

Then, it is determined whether the count of continued signals of the same polarity is equal to or more than a threshold Th (Step S15). If the count of continued signals is less than the threshold Th, the D/A converter controlling circuits 4 are switched to the deceleration mode (Step S13). If the count of continued signals is equal to or more than the threshold Th, the time interval t is decreased to t/2 (Step S16), and the acceleration mode is maintained (Step S17).

As described above, in the acceleration mode, if the polarity of the input signal 31 of the D/A converter controlling circuits 4 changes, the increment ΔV added last is subtracted. At the same time, the D/A converter controlling circuits 4 are switched to the deceleration mode. On the other hand, if the signals of the same polarity continue, the increment is increased in accordance with the count of the continued signals. Further, if the count of the continued signals of the same polarity is equal to or more than the predetermined value (threshold Th), the time interval t is decreased to t/2 and the D/A converter controlling circuits 4 maintain the acceleration mode.

FIG. 4 illustrates a deceleration mode operation of the D/A converter controlling circuits 4. As shown in FIG. 4, it is determined in Step S21 whether the polarity of the input signal 31 of the D/A converter controlling circuits 4 changes. If the polarity changes, the polarity of the increment ΔV added last is inverted and ½ the polarity-inverted increment is accumulated in the accumulator 4b (Step S22). Then, the time interval t is doubled (Step S23).

On the other hand, if the polarity of the input signal 31 remains unchanged, the following increment ΔV is accumulated in the accumulator 4b (Step S24):

ΔV=Integer part of (Count of continued signals of the same polarity/(t×polarity)).

Then, it is determined whether the count of continued signals of the same polarity is equal to or more than a threshold Th (Step S25). If the count of continued signals is equal to or more than the threshold Th, the controlling circuits 4 advance to Step S23. If the count of continued signals is less than the threshold Th, the D/A converter controlling circuits 4 maintain the deceleration mode (Step S26).

After Step S23, it is determined whether the time interval t is equal to or longer than the time interval t in the normal mode, i.e., the time interval t equal to the clock pulse period (Step S27). If the time interval t is equal to or longer than the time interval t in the normal mode, the D/A converter controlling circuits 4 are switched to the normal mode (Step S28). If the time interval t is shorter than the time interval t in the normal mode, the flow advances to Step S26 and the D/A converter controlling circuits 4 maintain the deceleration mode.

As described above, in the deceleration mode, if the polarity of the input signal 31 of the D/A converter controlling circuits 4 changes, the polarity of the increment ΔV added last is inverted and ½ the polarity-inverted increment is accumulated (½ the increment added last is subtracted) and thereafter the time interval t is doubled. On the other hand, if the signals of the same polarity continue, the increment reduces in accordance with the count of the continued signals. Further, if the count of the continued signals of the same polarity is equal to or more than the predetermined value (threshold Th), the time interval t is doubled. If the count of the continued signals of the same polarity is less than the predetermined value, the D/A converter controlling circuits 4 maintain the deceleration mode.

After the time interval t is doubled, if the time interval t is equal to or longer than the time interval t in the normal mode, the D/A converter controlling circuits 4 are switched to the normal mode. On the other hand, if the time interval t is shorter than the time interval t in the normal mode, the D/A converter controlling circuits 4 maintain the deceleration mode.

FIGS. 5 and 6 are diagrams showing a program written in the awk language, which describes operations of the A/D converter 1.

Figure 7A:
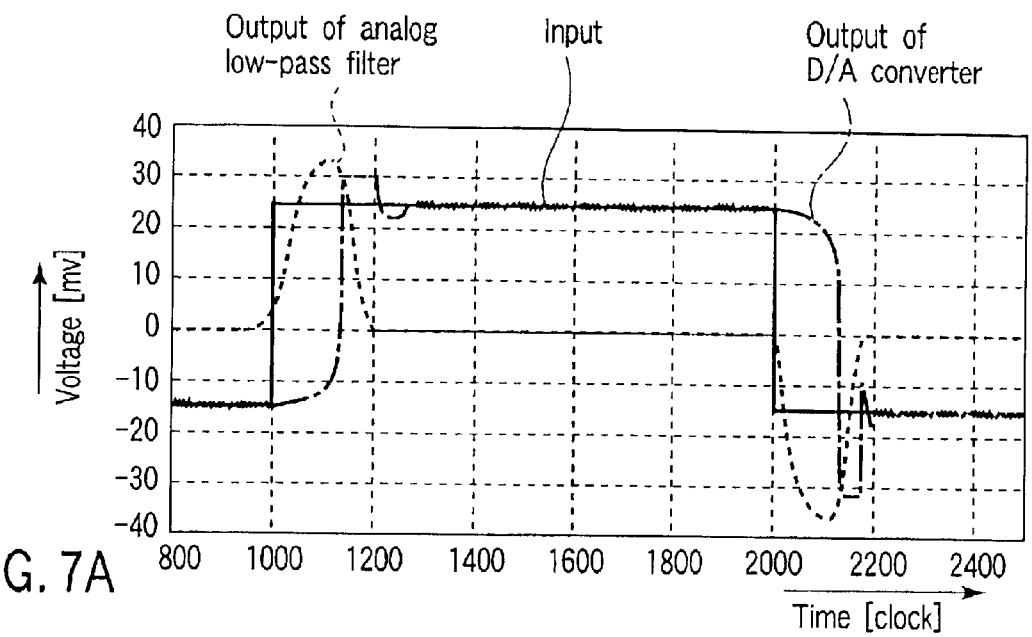
FIGS. 7A to 7C are waveform diagrams each showing an operation of the A/D converter according to the embodiment of the present invention.
Figure 7B:
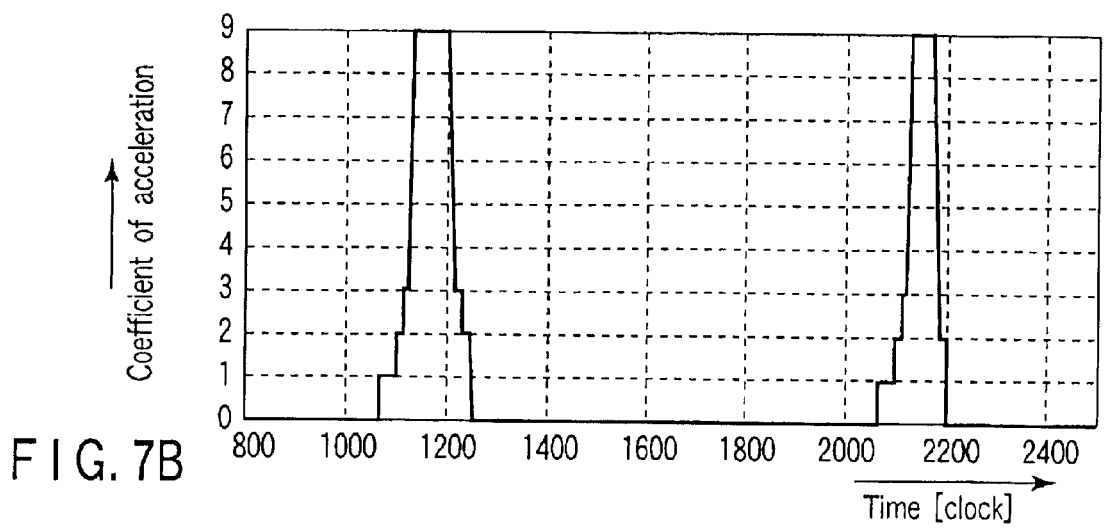
Figure 7C:
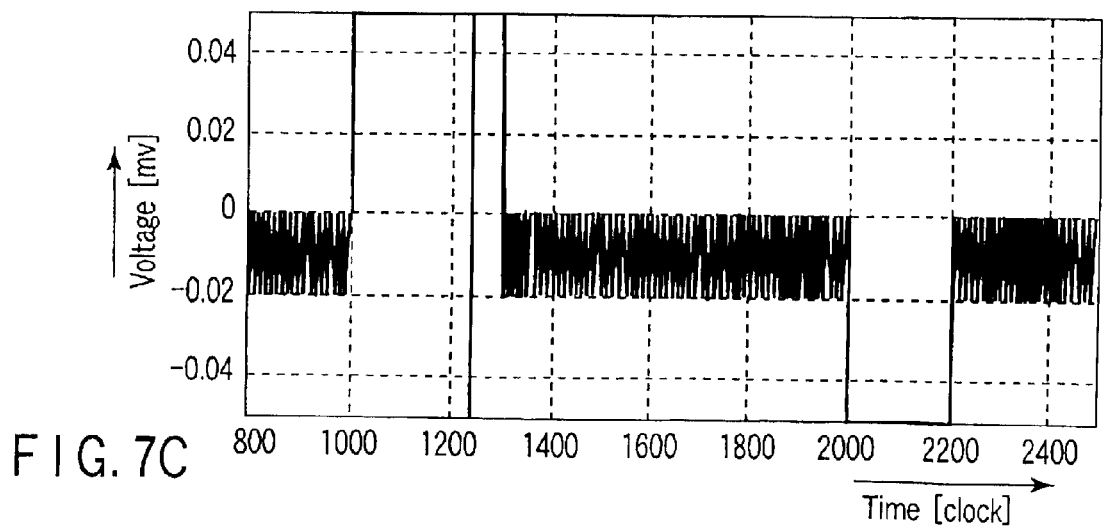

FIGS. 7A to 7C are waveform diagrams each showing an operation of the A/D converter 1. The waveforms are obtained by simulating the operation of the A/D converter 1 using the program shown in FIGS. 5 and 6.

In FIG. 7A, the analog input signal 11 represented by the solid line changes stepwise at the times at 1000 clocks and 2000 clocks. The broken line represents the output signal 21 of the analog low-pass filter 3a, which is the resultant signal obtained by filtering the analog input signal 11. The dot-chain line represents the output signal 61 of the D/A converter 6.

As shown in FIG. 7A, the output signal 61 starts changing after the analog input signal 11 changes. The period between the time at about 1120 clocks and the time at about 1200 clocks corresponds to the acceleration mode. The period between the time at about 1200 clocks and the time at about 1220 clocks corresponds to the declaration mode.

FIG. 7B shows coefficients of acceleration of the operations shown in FIG. 7A. The period in which the coefficient of acceleration is more than 1 corresponds to the acceleration mode. More specifically, as shown in FIG. 7B, in the period between the time at 1060 clocks and the time at 1160 clocks, the time interval to the next accumulation operation is exponentially shortened. Thereafter, the mode is switched to the acceleration mode at the time at about 1120 clocks and the accumulation speed is increased at an exponential increasing rate. The period between the time at 1200 clocks and the time at 1220 clocks corresponds to the deceleration mode, in which the accumulation speed is exponentially reduced. Thereafter, the time interval to the next accumulation operation is exponentially lengthened.

FIG. 7C is an enlarged view showing an error between the analog input signal 11 and the output signal 51 of the A/D converter 1 in the operation shown in FIG. 7A. As shown in FIG. 7C, the time required to is reduce the error to 0.625% of the full scale is about 300 clocks. According to the conventional A/D converter, the time required to reduce the error to 0.625% of the full scale is, for example, 600 clocks. Thus, the A/D converter of the embodiment of the present invention can perform following speed faster than the conventional A/D converter.

In the A/D converter 1 according to the embodiment of the present invention, the D/A converter controlling circuits 4 are set to the normal mode, the acceleration mode or the deceleration mode in accordance with the change in polarity of the output signal 41 of the comparing circuit portion 3b and the count of continued signals of the same polarity. In the normal mode, accumulation operations are performed at preset time intervals in predetermined increments. If certain conditions are satisfied in the normal mode, the mode is changed to the acceleration mode. In the acceleration mode, the speed of the accumulation is increased exponentially. Further, if certain conditions are satisfied in the acceleration mode, the mode is changed to the deceleration mode. In the deceleration mode, the speed of the accumulation is decreased exponentially. If certain conditions are satisfied in the deceleration mode, the mode is changed to the normal mode.

As described above, for example, if the analog input signal changes stepwise, the D/A converter controlling circuits 4 are switched to the acceleration mode, and the output signal 61 of the D/A converter 6 is accumulated until the value of the analog input signal 11 in a short period of time. In the acceleration mode, if the value of the output signal 61 of the D/A converter 6 exceeds the value of the analog input signal 11, the D/A converter controlling circuits 4 are switched to the deceleration mode, and the error between the output signal 61 of the D/A converter 6 and the analog input signal 11 is reduced to 0.625% of the full scale within a short period of time. Thus, the response of A/D conversion can be faster. For this reason, even if the clock pulse frequency is restricted to low, A/D conversion can be performed at high speed.

According to the above embodiment, in the acceleration or deceleration mode, both increment ΔV and time interval t are controlled. However, the present invention is not limited to this procedure. For example, in the acceleration mode, it is possible that either the increment ΔV is increased or the time interval t is decreased. Likewise, in the deceleration mode, it is possible that either the increment ΔV is decreased or the time interval t is increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of converting an analog input signal to a digital output signal by an analog/digital converter including a digital/analog converter outputting a first signal, a low-pass filter provided with a difference signal between the input signal and the first signal and outputting a filtered difference signal, an analog comparator provided with the filtered difference signal and outputting a second signal which is a positive or negative polarity unit value, and a digital/analog converter controller outputting a third signal, the analog/digital converter controlling the third signal to make the first signal approximate to the analog input signal in order to generate the digital output signal corresponding to the analog input signal from a row of the third signal, the method comprising:

causing the digital/analog converter controller to take one of a first to third accumulation mode; and causing the digital/analog converter controller to output the third signal which is generated by accumulating a variable value one after another at a variable interval, wherein in the first accumulation mode, the third signal is generated by accumulating a first value at a first interval, and the digital/analog converter controller switches to the second accumulation mode when count of continued second signals with a same polarity reaches a threshold, in the second accumulation mode, the third signal is generated by accumulating a value whose absolute value is greater than a last accumulated value at a same interval as a last interval or accumulating a same value as a last accumulated value at an interval shorter than a last interval, and the digital/analog converter controller switches to the third accumulation mode when the polarity of the second signal changes, and in the third accumulation mode, the third signal is generated by accumulating a value whose absolute value is smaller than a last accumulated value at a same interval as a last interval or accumulating a same value as a last accumulated value at an interval longer than a last interval, and the digital/analog converter controller switches to the first accumulation mode when a current interval reaches the first interval.

2. The method according to claim 1, wherein, in the first accumulation mode, the third signal is generated by accumulating a value whose absolute value is greater than a last accumulated value after the polarity of the second signal stays unchanged.

3. The method according to claim 1, wherein, in the second accumulation mode, the third signal is generated by accumulating a value whose absolute value is greater than a last accumulated value at an interval shorter than a last interval.

4. The method according to claim 1, wherein the second accumulation mode the third signal is generated by accumulating a value whose absolute value is greater than a last accumulated value after the polarity of the second signal stays unchanged.

5. The method according to claim 1, wherein, in the second accumulation mode, when count of continued second signals with a same polarity reaches a threshold, the third signal is generated by accumulating a value at an interval shorter than a last interval and the digital/analog converter controller maintains the second accumulation mode.

6. The method according to claim 1, wherein, in the third accumulation mode, the third signal is generated by accumulating a value whose absolute value is smaller than a last accumulated value at an interval longer than a last interval.

7. The method according to claim 1, wherein, in the third accumulation mode, the third signal is generated by accumulating a value whose absolute value is smaller than a last accumulated value after the polarity of the second signal stays unchanged.

8. The method according to claim 1, wherein, in the third accumulation mode, when count of continued second signals with a same polarity reaches a threshold, the third signal is generated by accumulating a value at an interval longer than a last interval.

9. An analog/ digital converter comprising:

a digital/analog converter outputting a first signal;

a low-pass filter provided with a difference signal between the input signal and the first signal and outputting a filtered difference signal;

an analog comparator provided with the filtered difference signal and outputting a second signal which is a positive or negative polarity unit value; and a digital/analog converter controller taking one of a first to third accumulation mode and outputting a third signal which is generated by accumulating a variable value one after another at a variable interval, wherein the analog/ digital converter controls the third signal to make the first signal approximate to an analog input signal to the analog/digital converter in order to generate a digital output signal corresponding to the analog input signal from a row of the third signal, in the first accumulation mode, the third signal is generated by accumulating a first value at a first interval, and the digital/analog converter controller switches to the second accumulation mode when count of continued second signals with a same polarity reaches a threshold, in the second accumulation mode, the third signal is generated by accumulating a value whose absolute value is greater than a last accumulated value at a same interval as a last interval or accumulating a same value as a last accumulated value at an interval shorter than a last interval, and the digital/analog converter controller switches to the third accumulation mode when the polarity of the second signal changes, and in the third accumulation mode, the third signal is generated by accumulating a value whose absolute value is smaller than a last accumulated value at a same interval as a last interval or accumulating a same value as a last accumulated value at an interval longer than a last interval, and the digital/analog converter controller switches to the first accumulation mode when a current interval reaches the first interval.

10. The converter according to claim 9, wherein the digital/analog converter controller comprises:
- an accumulator accumulating a variable value one after another at a variable interval to generate the third signal; and
- an accumulator controller controlling the accumulator according to the second signal.

11. The converter according to claim 9, wherein, in the first accumulation mode, the third signal is generated by accumulating a value whose absolute value is greater than a last accumulated value after the polarity of the second signal stays unchanged.

12. The converter according to claim 9, wherein,
in the second accumulation mode, the third signal is generated by accumulating a value whose absolute value is greater than a last accumulated value at an interval shorter than a last interval.

13. The converter according to claim 9, wherein, in the second accumulation mode, the third signal is generated by accumulating a value whose absolute value is greater than a last accumulated value after the polarity of the second signal stays unchanged.

14. The converter according to claim 9, wherein, in the second accumulation mode, when count of continued second signals with a same polarity reaches a threshold, the third signal is generated by accumulating a value at an interval shorter than a last interval and the digital/analog converter controller maintains the second accumulation mode.

15. The converter according to claim 9, wherein,
in the third accumulation mode, the third signal is generated by accumulating a value whose absolute value is smaller than a last accumulated value at an interval longer than a last interval.

16. The converter according to claim 9, wherein, in the third accumulation mode, the third signal is generated by accumulating a value whose absolute value is smaller than a last accumulated value after the polarity of the second signal stays unchanged.

17. The converter according to claim 9, wherein, in the third accumulation mode, when count of continued second signals with a same polarity reaches a threshold, the third signal is generated by accumulating a value at an interval longer than a last interval.

* * * * *